United States Patent
Feldtkeller (10) Patent No.: US 7,180,337 B2
(45) Date of Patent: Feb. 20, 2007

(54) METHOD FOR SWITCHING DRIVING OF A SEMICONDUCTOR SWITCHING ELEMENT

(75) Inventor: Martin Feldtkeller, München (DE)

(73) Assignee: Infineon Technologies AG, Munich (DE)

( * ) Notice: Subject to any disclaimer, the term of this patent is extended or adjusted under 35 U.S.C. 154(b) by 30 days.

(21) Appl. No.: 10/959,901

(22) Filed: Oct. 6, 2004

(65) Prior Publication Data

US 2005/0104650 A1   May 19, 2005

(30) Foreign Application Priority Data

Oct. 6, 2003   (DE) ................. 103 46 307

(51) Int. Cl.
*H03B 1/00* (2006.01)
*H03K 17/687* (2006.01)

(52) U.S. Cl. ...................... 327/108; 327/427

(58) Field of Classification Search ................ 327/379, 327/427, 108, 112, 434
See application file for complete search history.

(56) References Cited

U.S. PATENT DOCUMENTS

| | | | | |
|---|---|---|---|---|
| 4,859,875 A | * | 8/1989 | Tihanyi et al. | .............. 327/424 |
| 4,860,152 A | * | 8/1989 | Osborn | ...................... 361/91.7 |
| 6,107,860 A | * | 8/2000 | Vinciarelli | ................... 327/427 |
| 6,373,296 B1 | * | 4/2002 | Auer et al. | .................. 327/108 |
| 6,456,156 B1 | * | 9/2002 | Frey et al. | .................... 327/541 |
| 6,556,407 B2 | | 4/2003 | Brando et al. | ............. 361/100 |
| 6,700,428 B2 | * | 3/2004 | Sander | ....................... 327/312 |
| 6,774,682 B2 | * | 8/2004 | Theobald et al. | ........... 327/110 |
| 2001/0040470 A1 | | 11/2001 | Brando et al. | .............. 327/109 |

FOREIGN PATENT DOCUMENTS

DE   197 25 837 A1   12/1998
DE   198 55 604 C1   6/2000

* cited by examiner

*Primary Examiner*—My-Trang Nu Ton
(74) *Attorney, Agent, or Firm*—Maginot, Moore & Beck (57) ABSTRACT

A method of driving a semiconductor switching element includes applying a drive signal configured to switch the semiconductor element such that a change in the charge stored on the drive electrode occurs over time, the drive signal having one or more predetermined parameters that define a time profile of the drive signal. The method also includes determining a deviation between an ideal switching instant of the semiconductor switching element and an actual switching instant of the semiconductor switching element, the ideal switching instant defined in reference to the time profile of the drive signal and/or a signal having a characteristic that is dependent on the time profile of the drive signal. The method further includes changing at least one of the predetermined parameters of the drive signal for a next switching operation based on the determined deviation.

20 Claims, 4 Drawing Sheets

METHOD FOR SWITCHING DRIVING OF A SEMICONDUCTOR SWITCHING ELEMENT

The present invention relates to a method for switching driving of a semiconductor switch.

BACKGROUND

Semiconductor switches such as, for example, MOSFET or IGBT, are in widespread use as electronic switches for switching loads. Examples of these are half bridge or bridge circuits, in particular bridge circuits for driving electric motors, or switch-mode power supplies in which there is present a switch regulating the power consumption that is switched in series with an inductive storage element.

In the case of the switching operations, there is firstly the aim of achieving as short as possible a turn-on time, which denotes time duration of a transition from the completely off state to the completely on state of the semiconductor switch, and as short as possible a turn-off time, which denotes the time duration of a transition from the completely on state to the completely off state of the semiconductor switch, in order to minimize switching losses that occur. Secondly, however, the switching edges that occur in the load current or the voltages present across the load and the semiconductor switch are to be suitably flattened off in order to limit the frequency spectrum of the electromagnetic stray radiation. This applies, in particular to switching applications in which the voltage is not shielded by electromagnetic shielding measures such as a metal cage, for example. The particular aim in this case is edge durations of between 50 ns and 100 ns. The frequencies of the stray radiations occurring in this case are then predominantly below 30 MHz, and therefore propagate in a conductive fashion. Such stray radiations can be filtered out by means of filter circuits such that there is no need for expensive mechanical shielding measures.

DE 197 25 837 C2 discloses a drive circuit for an MOS transistor that provides a drive signal for the MOS transistor that has three sections, the drive signal being slowed down during a second section by comparison with a first and third section. Use is also made in this case of the fact that up to a specific value of the drive signal that depends on the component—that is to say the gate-source voltage for MOSFET—the MOS transistor is in the off state and so the drive signal can rise rapidly up to this value without this resulting in a change in the switching state, and therefore in a change in the load path voltage or in the load current. During an adjoining second phase, the component goes over from the off state to the on state, and so the rise in the drive signal is slowed down during this phase in order to reduce the steepness of a switching edge occurring during the second phase. During a subsequent third section of the drive phase, the component is already on, and so the drive signal can rise rapidly during this phase up to its maximum value. Overall, it is possible by means of such a three-stage drive to optimize the switching behavior with reference to the steepness of the switching edges and to switching speed.

In order to carry out such a three-stage drive method, it is proposed in DE 198 55 604 C1 for the purpose of turning on a power MOSFET to supply a first charging current to the drive electrode of the MOSFET during a first drive phase until the drain current of said MOSFET exceeds a current threshold value, and to deliver a second, smaller charging current to the drive electrode during a subsequent second phase until the drain voltage of the MOSFET falls below a prescribed threshold value that signals the turning on of the MOSFET. During a subsequent third phase, the first, larger charging current is supplied to the drive electrode of the MOSFET once again for a prescribed time duration. The method is performed in the reverse sequence when the MOSFET is being turned off.

It is common to the known methods that the criteria for a transition from one drive phase to a next drive phase are tuned permanently to the respective component such that a drive circuit that is tuned for driving a specific type of semiconductor switch can no longer be used for another type which has, for example, another threshold voltage. Even manufacturing fluctuations in the component parameters of a semiconductor switch can have the result that the prescribed thresholds for the transition to another drive phase no longer lead to an optimum drive operation of the semiconductor switch.

SUMMARY

The object of the present invention is to provide a method for driving a semiconductor switch in which, in particular, the above named disadvantages do not occur.

The method for driving a semiconductor switch whose switching state is a function of a charge stored on a drive electrode, and which has a drive terminal for applying a drive signal, as well as a load path, comprises applying a drive signal that is selected such that a change in the charge stored on the drive electrode occurs over time, signal parameters that define the time profile of the drive signal being permanently prescribed for a switching operation. The method also provides for determining an ideal switching instant of the semiconductor switch with reference to the time profile of the drive signal or of a signal dependent thereon, and determining whether the actual switching instant of the semi-conductor switch with reference to the time profile of the drive signal deviates from the ideal switching instant. If such a deviation of the prescribed switching instant from the ideal switching instant is determined, at least one of the parameters of the drive signal is changed for the subsequent switching operation.

The drive signal is preferably corrected only when the actual switching instant deviates from the ideal switching instant by more than a prescribed reference time duration.

In the method according to the invention, the profile of the drive signal is adapted iteratively from switching operation to switching operation until the actual switching instant with reference to the time profile of the drive signal deviates from the ideal switching instant no longer or by less than the prescribed time duration.

In order to determine the switching instant, for example, a voltage across the load path of the semiconductor switch is evaluated, the switching instant corresponding to an instant at which the load path voltage reaches a prescribed value with reference to a maximum load path voltage, for example 50% of the maximum load path voltage. There is also the possibility of evaluating the profile of the load current through the semiconductor switching element in order to determine the switching instant.

Serving as drive signal for turning or turning off a semiconductor switch having a drive electrode, in particular a MOSFET or IGBT is a drive current that charges the drive electrode to turn on the semiconductor switch, and discharges it in order to turn off the semiconductor switch. The ideal switching instant can be determined in this case both with reference to this drive current and with reference to the time profile of a signal dependent on this drive current, for example the drive voltage present at the drive terminal, or the charge on the drive electrode.

It is provided in one embodiment that a drive current for switching driving of the semiconductor switch has in time consecutively at least one first section of a first time duration with a first amplitude, and a second section of a second time duration with a second amplitude. The respective amplitudes and the respective time durations of these sections are in this case adjustable parameters of the drive signal that can be varied in order to correct the actual switching instant to the ideal switching instant.

Such a method is fundamentally suitable both for turning on and for turning off a semiconductor switch, the current directions of the drive current differing, of course, for the turning-on operation and the turning-off operation.

The ideal switching instant can be selected as a function of the respective requirements, this being done as desired with reference to the time profile of the drive signal. If the drive electrode is first to be charged slowly during the turn-on operation, for example during the first drive phase, until switching on has been performed, and thereafter to be charged quickly, the ideal switching instant is selected such that it is within the first drive phase, for example a prescribed time duration after the start or before the end of the first drive phase. If, however, the actual switching instant is within the second phase during a drive operation, the first time duration is extended, for example, in order to displace the actual switching instant into the first drive phase.

If, by contrast, the drive electrode is firstly to be discharged quickly during turning off, and more slowly thereafter, the ideal switching instant is selected in order to reduce the EMC stray radiation such that it is within the second drive section. If, however, the actual switching instant is within the first phase during a drive operation, the first time duration is reduced, for example, in order to displace the actual switching instant into the second drive phase.

The time profile of the drive current preferably comprises three sections, the amplitudes of two respective consecutive sections differing, and the second section having a lesser amplitude than the first and third section. In this case, the ideal switching instant is preferably temporally within the second section of this time profile during which the drive electrode is charged in order to turn on the switching element with the aid of a lesser charging current than during the second or third section, and during which the drive electrode is discharged in order to turn off the witching element with the aid of a lesser discharging current than during the first and third section. If the actual switching instant is within this second section, a flattened switching edge of the semiconductor element is reached, whereas in the first and third section a quick charging or discharging of the drive electrode is achieved in order to achieve an overall switching duration that is as short as possible.

It is possible with this method, as well, for the time duration or the amplitude of the drive current in the first section to be varied as parameters when the actual switching instant deviates from the ideal switching instant.

It is provided in the case of another embodiment that the drive signal is selected such that the time profile of the drive voltage has at least two sections of different gradient for a switching operation, the time duration of the first and second section and/or the gradient of the sections being parameters that can be adjusted via the drive signal.

If, in the case of this method, the actual switching instant deviates from the ideal switching instant by more than the prescribed time duration, the time duration of the first section is varied, for example, in this method. In order to adjust the time duration of the first and at least one second section of the drive voltage, the drive voltage is preferably compared with a first and second reference value, at least one of the two reference values being varied as a function of a temporal spacing between the actual switching instant and the ideal switching instant.

The time profile of the drive voltage preferably comprises at least three sections, of which in each case consecutive sections have a different gradient, the second section preferably having a lesser gradient than the first and third section. In the case of this method, the ideal switching instant is preferably selected such that it is in the second section, in order thereby to obtain a flattened switching edge, but to optimize the switching operation with regard to its overall duration.

It has been assumed in the case of the method explained so far that a temporal spacing between the actual switching time and a respective ideal switching time is determined, at least one of the parameters of the drive signal being varied as a function of this temporal spacing. In the case of a simplified embodiment, instead of such a time difference measurement it is also possible to determine at a prescribed instant, for example at the end of the second drive period in each case, whether a switching operation, that is to say a turning on or a turning off, has taken place, in order as a function thereof to vary the respective parameters of the drive current or the drive voltage.

BRIEF DESCRIPTION OF THE DRAWINGS

The present invention is explained in more detail below in exemplary embodiments with the aid of figures, in which.

DETAILED DESCRIPTION

Figure 1:
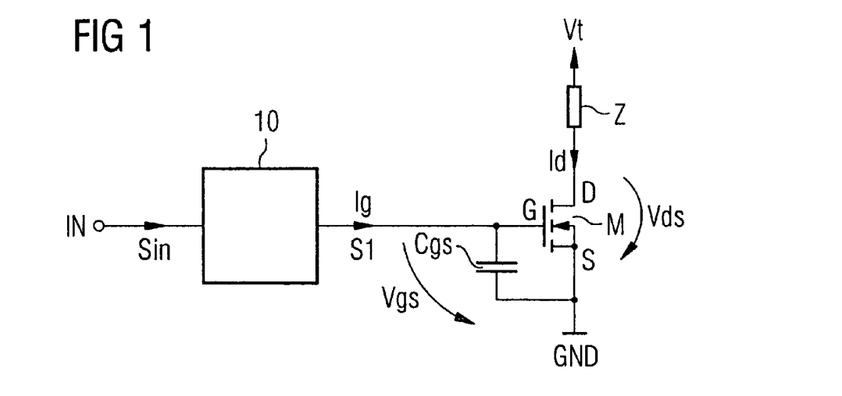
FIG. 1 shows a circuit arrangement having a semiconductor switching element, designed as a MOSFET for switching a load connected in series with a load path, and having a drive circuit.

In order to provide a better understanding of the drive method explained below, FIG. 1 shows a circuit arrangement having a semiconductor switching element M that is designed as MOSFET and whose load path or drain-source path D-S is connected in series with a load Z between a terminal for a positive supply potential V+ and a terminal for negative supply potential or reference potential GND. The MOSFET illustrated is connected as a low-side switch whose load path D-S is thus between the load Z and reference potential GND.

The MOSFET M has a gate electrode G that forms the drive electrode thereof. The MOSFET M turns on and off in a way that is sufficiently well known as a function of a drive voltage Vgs between the gate electrode G thereof and the source terminal S thereof, which forms one of the load terminals of the MOSFET, this drive voltage Vgs being a function of a charge stored on a gate-source capacitor Cgs or on the gate electrode G of the MOSFET.

Provided for the purpose of driving the MOSFET M is a drive circuit 10 that turns the MOSFET M on or off in accordance with an input signal Sin present at an input terminal IN.

Figure 2A:
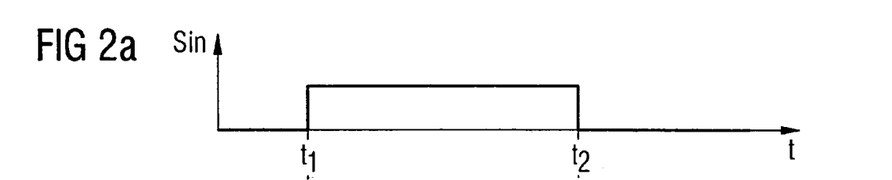
FIGS. 2a–2c illustrate for an exemplary embodiment of the method a three-stage time profile, targeted with the reduction of EMC stray radiation, of the drive voltage, and of the time profile, resulting therefrom, of the load path voltage of the MOSFET.
Figure 2B:
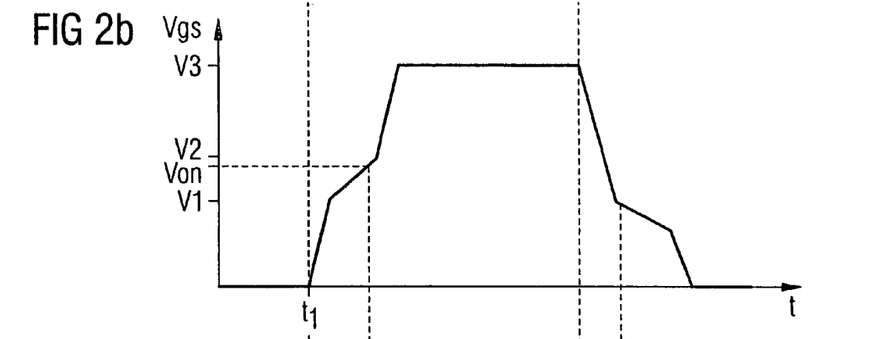
Figure 2C:
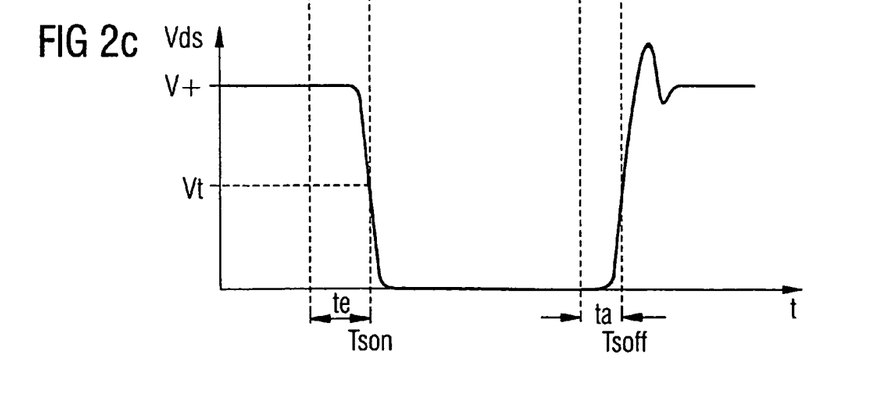

By way of example, FIG. 2b illustrates a time profile of the drive voltage Vgs, desired in order to achieve an EMC-optimized switching behavior, as a function of the input signal Sin illustrated in FIG. 2a. The time profile, resulting from this drive voltage Vgs, of the drain-source voltage Vds, which reproduces the switching profile, is illustrated in FIG. 2c.

The drive voltage Vgs has a three-stage profile for the turn-on operation, which starts at the instant t1 in the exemplary embodiment illustrated. At the start of the turn-on operation, the drive voltage Vgs firstly rises with a first gradient until the drive voltage Vgs reaches a first voltage value V1, and rises further thereafter with a second gradient, which is smaller than the first gradient, until the drive voltage Vgs reaches a second reference value V2, and subsequently rises with a third gradient up to a third reference value V3, which corresponds, for example, to the positive supply potential V+.

With reference to FIG. 2b, the turn-off operations taking place between individual turn-on operations likewise ideally run in three stages, in which case, starting from the third reference value V3, the drive voltage Vgs firstly decreases with a fourth gradient until reaching a fourth reference value V4, subsequently decreases with a fifth gradient, which is smaller than the fourth gradient, down to a fifth reference value V5, and subsequently decreases with a sixth gradient, which is, for example, identical to the fourth gradient, down to a final value that corresponds in the example to a drive voltage Vgs=0. The ideal switching instant during this turn-off operation is within the second drive section during the turn-off operation, the turn-on instant corresponding to the instant at which the load path voltage Vds has risen as far as the value of the threshold voltage Vt that corresponds preferably to 50% of the maximum load path voltage.

The gradient of the drive voltage Vgs over time is a function of the input capacitance of the MOSFET, which comprises the gate-source capacitance and the drain-gate capacitance. In the third section of the turn-on operation, and in the first section of the turn-off operation, this input capacitance of conventional MOSFETs is greater than in the first section of the turn-on operation and in the third section of the turn-off operation, because the drain-gate capacitance is a function of the voltage present. The result of this is that given the same charging current in the first and third section of the turn-on operation the drive voltage rises more steeply in the first section, because of the smaller input capacitance, than in the third section. The charging current for the first section is preferably selected such that a prescribed time duration for this section is not fallen below, and as such that the drive voltage Vgs does not rise too steeply, in order to be able to detect as accurately as possible when the first reference voltage V1 is reached. Given an identical charging current in the first and third section of the turn-off operation, a larger gradient results in the third section, because of the then smaller input capacitance, than in the first section.

The turn-on instant of the MOSFET M, which is defined in the exemplary embodiment by virtue of the fact that the drain-source voltage Vds has sunk to a threshold value Vt, is temporally in the region of the second drive section of the drive voltage Vgs during the turn-on operation. The threshold value Vt preferably corresponds to 50% of the maximum voltage present across the load path of the MOSFET M, in the present case 50% of the positive supply potential V+. A turn-on duration te is defined as the time duration between the start of the turn-on operation at the instant t1 and the actual turn-on instant Tson defined by the threshold voltage Vt.

The illustrated three-stage time profile of the drive voltage Vgs with more steeply rising first and third sections of the drive voltage Vgs and a more flatly rising second section, in which the turn-on instant Tson is to be found, ensures a turn-on operation that, firstly, is optimized with regard to the steepness of the switching edge, resulting therefrom, of the load current Id or of the load path voltage Vds, and in which, secondly, a sufficiently high switching speed is ensured. This switching speed is achieved by virtue of the fact that the drive voltage rises steeply before and after the switching instant Tson, by virtue of the fact that the gate-source capacitance Cgs is charged more quickly during the first and third section than in the second section.

With reference to the drive voltage Vgs, the turn-on instant is reached in the illustrated exemplary embodiment when the drive voltage Vgs has risen to a value Von.

Figure 3A:
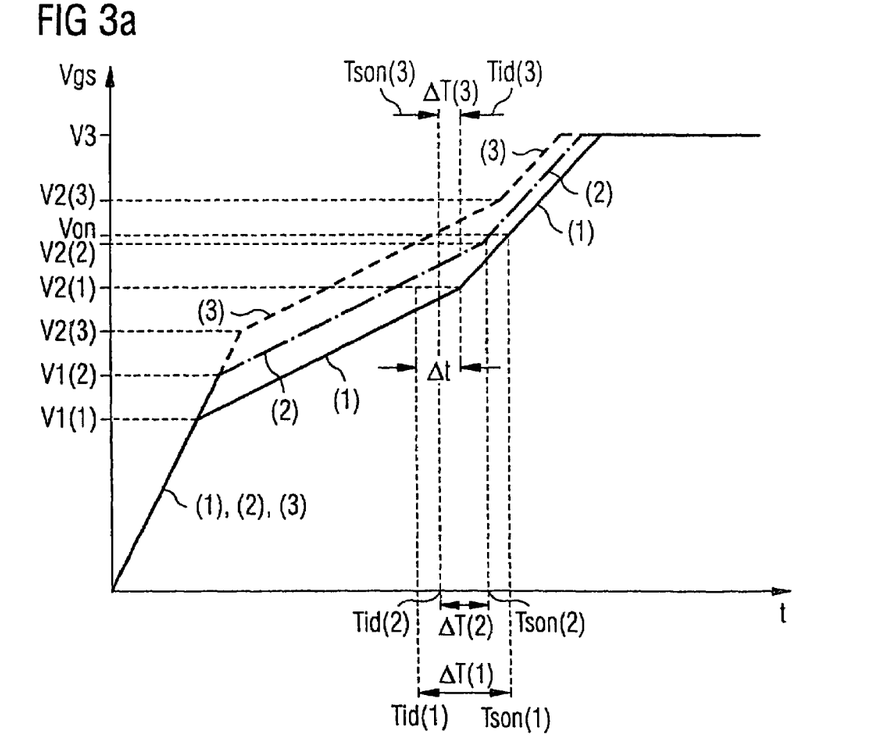
FIGS. 3a–3b illustrate the iterative procedure, applied in the inventive method, for adjusting this desired time profile according to FIG. 2 for the turn-on operation.
Figure 3B:
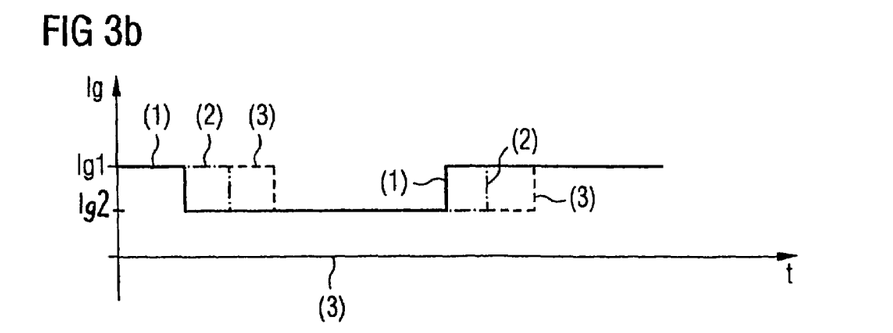

In order to obtain this ideal turn-on profile, the first and reference voltage V1, V2 are to be tuned to this turn-on voltage Von of the MOSFET M. In the case of the method according to the invention, this tuning of reference values is performed iteratively from turn-on operation to turn-off operation, as is firstly illustrated below for the turn-on operation with the aid of FIG. 3.

FIG. 3a shows three time profiles of the drive voltage Vgs for three temporally consecutive turn-on operations of the MOSFET M, these time profiles being illustrated one above another for the purpose of better understanding of the method according to the invention. The continuous curve denoted by (1) shows the profile of the drive voltage Vgs for a first turn-on operation, the dashed and dotted curve, denoted by (2), shows the profile of the drive voltage Vgs for a second turn-on operation, and the dashed curve denoted by (3) shows the profile of the drive voltage Vgs for a third turn-on operation.

During the first turn-on operation, the drive voltage Vgs rises with a first gradient up to the first reference voltage V1(1), subsequently rises with a second, smaller gradient up to the second reference voltage V2(1) and subsequently rises with a third gradient, which is preferably identical to the first gradient, up to the third reference value V3. The turn-on voltage Von is firstly higher than the second reference voltage V2(1), and so the actual turn-on instant Tson with reference to the time profile of the drive voltage Vgs is in the third section of this drive voltage Vgs. It may be assumed for the further explanation that the ideal turn-on instant of the MOSFET M with reference to the time profile of the drive voltage Vgs is in the second drive section, in order to achieve a flattened switching edge. This ideal switching instant is denoted in FIG. 3a by Tid(1) for the first turn-on operation. This ideal turn-on instant Tid(l) is defined in the illustrated exemplary embodiment with reference to the end of the second drive section, and is at a prescribed time duration At before the end of this second drive section or the beginning of the third drive section.

The MOSFET turns on when the drive voltage has risen up to a value Von. This value is reached for the first turn-on operation at the turn-on instant Tson(1). The method according to the invention now provides to determine the temporal spacing between the actual turn-on instant Tson(1) and the ideal turn-on instant Tid(1), which is denoted by ΔT(1) in FIG. 3a, and this time difference is compared to a reference value in order to vary the parameters of the time profile of the drive signal Vgs during a next turn-on operation when this temporal spacing is greater than the prescribed reference value.

In the method illustrated in FIG. 3a, it is provided in this case to vary the duration of the first drive section as the parameter of the time profile of the drive voltage Vgs, and this is achieved by increasing or decreasing the first reference voltage, the duration of the second drive section preferably remaining constant. In order to leave the duration of this second drive section constant, the second reference value is increased or decreased in the example to the same extent as the first reference value.

In the example, the temporal spacing between the actual switching instant Tson(1) and the ideal switching instant Tid(1) is greater during the first turn-on operation than the time reference value (not illustrated in more detail), which corresponds, for example, to the value Δt, and is situated temporally after the ideal switching instant Tid(1). The first reference value is therefore increased for the next turn-on operation, as shown by curve (2). During this turn-on operation, the drive voltage Vgs rises during the first section up to an increased first reference value V1(2). During the subsequent second section, the drive voltage Vgs rises up to an increased second reference voltage V2(2), and rises up to the third reference value V3 during the subsequent third section. By contrast with the first turn-on operation, the duration of the first section is temporally extended, the duration of the second section is the same, and the duration of the third section is curtailed. The ideal switching instant Tid(2), which is defined, in turn, with reference to the end of the second drive section, is displaced rearward temporally with reference to the ideal switching instant Tid(1) during the first turn-on operation by comparison with the start of the turn-on operation, and is therefore nearer the actual switching instant Tson(2) that is present when the drive voltage Vgs reaches the turn-on voltage Von. During this turn-on operation illustrated in FIG. 3a, the turn-on instant Tson(2) is also in the third drive section, and the temporal difference ΔT(2) between the ideal switching instant Tid(2) and the actual switching instant Tson(2) is greater than the prescribed time reference value, and so the first voltage reference value, and thus also the second voltage reference value, is further raised for a next turn-on operation, as shown by curve (3).

During this further turn-on operation, the drive voltage Vgs rises during the first drive section up to a first reference value V1(3), which is once again increased by comparison with the reference value V1(2) in the case of the previous turn-on operation. During a subsequent second drive section, the drive voltage Vgs rises up to a likewise increased second reference value V2(3), the drive voltage Vgs rising during the subsequent third section up to the third reference value V3. During this third turn-on operation, the drive voltage Vgs now rises within the first section to such an extent that the turn-on voltage Von is reached within the more flatly running second drive section. A temporal spacing between the ideal switching instant Tid(3), which is again ahead of the end of the second drive section by the time duration Δt, and the actual switching instant Tson, is ΔT(3). It may be assumed that this value ΔT(3) is smaller than the prescribed time reference value, and so the end of the iteration steps for adjusting the time profile of the drive voltage Vgs is reached. This adjustment with the reference values V1(3), V2(3) is permanently maintained for subsequent turn-on operations, the temporal position of the actual turn-on instant Tson always being determined with reference to the fixed, ideal switching instant, in order to collect the time profile of the drive voltage Vgs, if appropriate.

As may be seen from FIG. 3a, assuming that the gradient of the drive voltage is steeper in the first drive section than in the second and third drive section, every increase in the first reference value leads to a curtailment of the turn-on time that denotes the time period between the start of the turn-on operation and when the turn-on voltage Von is reached.

The temporal spacing between the actual switching instant and the ideal switching instant can be determined, for example, indirectly via the time duration between the start of the respective drive operation and the actual switching instant. If, for example, the ideal switching instant is defined with reference to the start or the end of the second drive section, and if the drive is performed such that the second drive section is always of the same length, it is therefore possible to draw direct conclusions on the relative temporal position of the actual switching instant in relation to the ideal switching instant from the time duration between the start of the drive operation and the actual switching instant.

FIG. 3b shows by way of example the time profiles of the drive current Ig for achieving the time profiles of the drive voltage Vgs that are illustrated in FIG. 3a. The gate electrode G of the MOSFET is respectively charged by a first charging current Ig1 during the first drive section, by a second charging current Ig2, which is smaller than the first charging current Ig1, during the second section, and by a third charging current, which corresponds to the first charging current Ig1 in the example, during the third section. In the illustrated example, in which the actual switching instant Tson is situated temporally after the desired ideal switching instant, the first drive section is extended in the way explained—remaining constant during the second drive section—up to the actual switching instant within a time window, prescribed by the time reference value, around the ideal switching instant.

The time profile of the drive voltage Vgs was considered in the case of the iterative control method previously explained, the first reference value V1(.) being varied as a function of the temporal spacing of the actual switching instant Tson from an ideal switching instant Tid(.).

Referring to the time profile, illustrated in FIG. 3b, of the drive current Ig, it is also possible to increase or decrease the turn-on operation by varying the time duration of the first section during which the first drive current Ig1 flows onto the gate electrode, as a function of the temporal position of the actual turn-on instant Tson with reference to the ideal switching instant. Considering the time profiles of the drive current Ig for the first, second and third illustrated turn-on operation, assuming that the ideal switching instant is at a prescribed time duration ahead of the end of the second drive section, the first drive section is increased from turn-on operation to turn-off operation until, during the third turn-on operation, the actual turn-on instant Tson is within the second drive section, in which the gate electrode Ig is charged by the second, smaller charging current Ig2.

If the actual switching instant is ahead of the ideal switching instant in time, when evaluating the drive voltage Vgs for the purpose of adjusting the switching behavior in a way not illustrated in more detail, the first voltage reference value is gradually reduced from turn-on operation to turn-on operation until the actual switching instant is within a prescribed time window around the ideal switching instant.

In this case, when considering the drive current Ig the first drive section is gradually reduced over time in a corresponding way until the actual switching instant of the MOSFET is within a prescribed time window around the ideal switching instant.

As already mentioned the ideal, switching instant is fixed relative to the time profile of the drive voltage Vgs or relative to the time profile of the drive current Ig, for example by virtue of the fact that the ideal switching instant is at a prescribed time duration after the start or before the end of the second drive section. It may be necessary to take account of signal propagation delays when determining the actual turn-on instant of the MOSFET, which is performed, for example, by comparing the load path voltage Vds of the MOSFET M with a reference voltage. Thus, at the instant at which an evaluation circuit indicates the turning on of the MOSFET the actual turn-on instant can already be put back by the duration of the signal propagation delays that occur. These signal propagation delays can be taken into account by an appropriate displacement of the desired ideal switching point. If, for example, it is desired actually to turn on the MOSFET during the second drive section at a predetermined time duration before the end of the second drive section in each case, by taking account of the signal propagation delays the ideal switching instant is displaced backward in time by the value of these signal propagation delays, and can then, if appropriate, already be in the third drive section of the time profile of the drive voltage Vgs or of the drive current Ig. If the switching instant is controlled up to this ideal switching instant, the actual switching instant is already ahead of the ideal switching instant by the value of these signal propagation delays, and therefore still within the second signal section.

The variation in the first voltage reference value $V1(.)$ and, if appropriate, in the second voltage reference value $V2(.)$ or in the time duration of the first drive section can be performed in identical steps in each case from turn-on operation to turn-on operation when the actual switching instant is not within the prescribed time window around the ideal switching instant. Furthermore, it is possible for the temporal spacing between the actual switching instant and the ideal switching instant to be taken into account when varying the first voltage reference value or the time duration of the first drive section, that is to say to increase the voltage reference value or the time duration of the first drive section the more strongly by comparison with the previous value the larger the temporal spacing between the actual switching instant and the ideal switching instant.

In order to adjust the first voltage reference value, it is possible, for example, to provide an integrating controller which, after each turn-on operation, is fed a value dependent on the temporal spacing between the ideal switching instant and the actual switching instant, and which provides the first voltage reference value for the next turn-on operation. The second voltage reference value preferably differs from the first voltage reference value by a prescribed offset such that the duration of the second drive section remains the same from turn-on operation to turn-on operation.

Figure 4A:
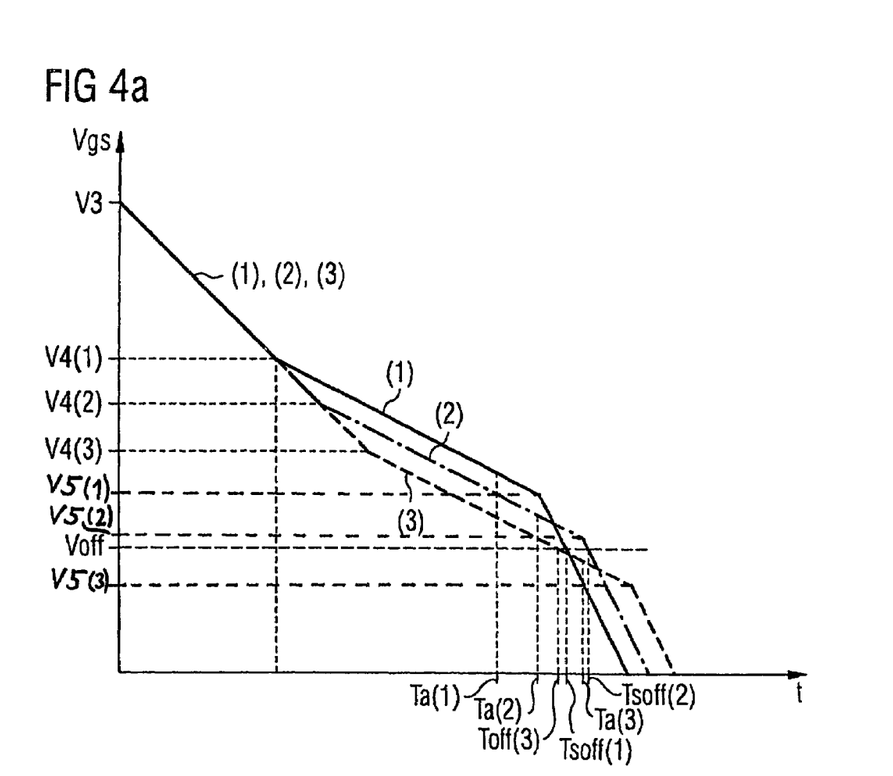
FIGS. 4a–4b illustrate the iterative procedure, applied in the inventive method, for adjusting the desired time profile according to FIG. 2, for the turn-off operation.

FIG. 4 illustrates the inventive iterative adjusting operation of the time profile of the drive voltage Vgs for the turn-off operation in the case of a three-stage method for the turn-off operation. The respective turn-off instant is reached with reference to the illustration in FIG. 4a when the control voltage Vgs has sunk down to a turn off value Voff. The continuous curve denoted by (1) in FIG. 4a shows the time profile of the drive voltage Vgs for a first turn-off operation. $V4(1)$ denotes the fourth reference voltage for this first turn-off operation, and $V5(1)$ denotes the fifth reference voltage for this first turn-off operation. The turn-off voltage Voff is lower than the fifth reference voltage $V5(1)$, and so during the first turn-off operation the actual turn-off instant $Tsoff(1)$ is within the third time section of the drive voltage Vgs during this turn-off operation. In order to achieve that the actual turn-off instant Tsoff is within the second time section of the time profile of the drive voltage Vgs, the fourth reference value is varied in the exemplary embodiment, the fifth reference value being varied correspondingly in order to achieve a constant time duration of the second drive section. During the subsequent second turn-off operation, the drive voltage Vgs sinks down to a reduced fourth reference value $V4(2)$ during the first drive section, and down to a reduced fifth reference value $V5(2)$ during the subsequent second drive section. This fifth reference value $V5(2)$ is still larger than the turn-off voltage Voff, and the temporal spacing between the actual turn-off instant $Tsoff(2)$ and the ideal turn-off instant $Ta(2)$ is still larger than the prescribed reference duration, and so during the subsequent third turn-off operation the fourth reference value is correspondingly reduced further down to a value $V4(3)$, and the fifth reference value $V5(3)$ is correspondingly reduced. During this third turn-off operation, the actual turn-off instant $Tsoff(3)$ is then within the second drive section and, moreover, within a prescribed time window around an ideal turn-off instant $Ta(3)$, such that the time profile illustrated, which is denoted by (3), with the reference values $V4(3)$, $V5(3)$ is maintained for subsequent turn-off operations.

Figure 4B:
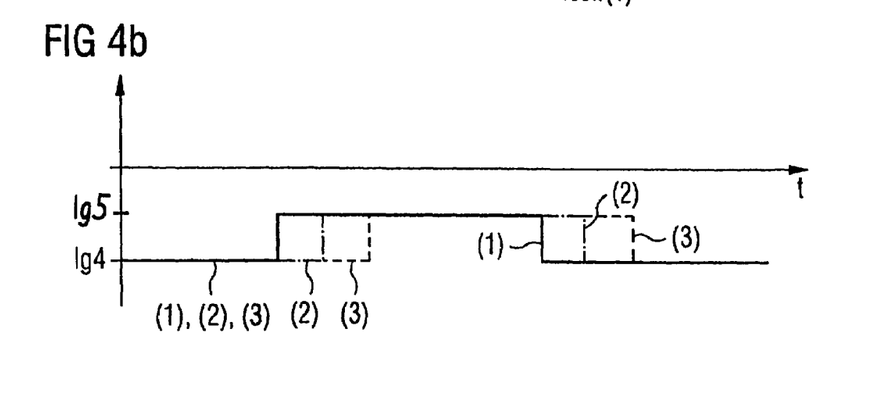

FIG. 4b shows the time profile of the drive current Ig for achieving the time profile, illustrated in FIG. 4a, of the drive voltage Vgs. In this case, the gate electrode G of MOSFET M is discharged by a fourth discharging current Ig4 during the first drive section, by a fifth discharging current Ig5 during the second section, and by a sixth discharging current, which preferably corresponds to the fourth discharging current Ig4, during the third section. In accordance with the procedure during turning on, instead of the drive voltage Vgs it is possible to consider the time profile of the drive current Ig for the purpose of optimizing the turn-off operation, in which case the time duration of the first drive period is varied in the event of a deviation of the actual turn-off instant Tsoff referring to an ideal turn-off instant that can be defined by the time profile of the drive current Ig.

In addition to a variation in the time duration of the first and/or second drive section both during the turn-on operation and during the turn-off operation, the possibility further exists of varying the amplitude of the charging current or discharging current during the first drive section, and this equates to varying the gradient of the drive voltage Vgs during the first drive section.

In the illustrations in accordance with FIGS. 3 and 4, the time profiles of the drive voltage Vgs and of the drive current Ig each have "hard" transitions between the individual drive sections, that is to say the gradient of the drive voltage Vgs changes abruptly between the individual drive sections, and the amplitude of the drive current Ig changes abruptly in a corresponding way. Of course, it is also possible to set softer transitions between the individual drive sections, and this can be achieved, for example, by having the drive current increase or decrease slowly between the individual drive sections.

By way of summary, a deviation of an actual switching instant in relation to an ideal switching instant is determined in the case of the previously explained three-stage method, and the time duration of the first drive section is extended when the actual switching instant is after the ideal switching instant, and curtailed when the actual switching instant is ahead of the ideal switching instant. The duration of the first drive section can be adjusted by adjusting a voltage reference value with which the drive voltage Vgs is compared in order to adjust the duration of the first drive section.

Figure 5A:
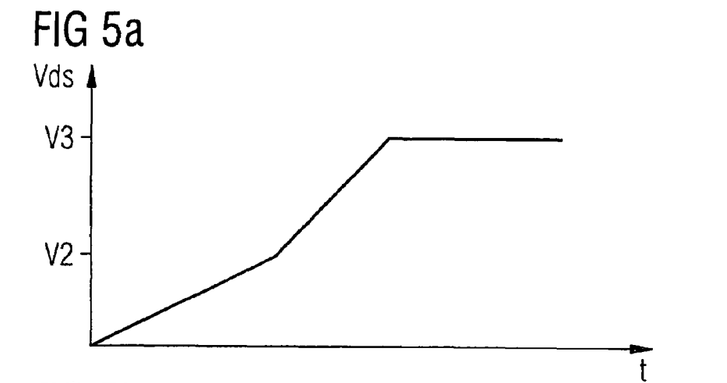
FIGS. 5a–5b illustrate the profile of the drive voltage (FIG. 5a) and of a charging current (FIG. 5b) for a two-stage drive method for turning on the semiconductor switch.
Figure 5B:
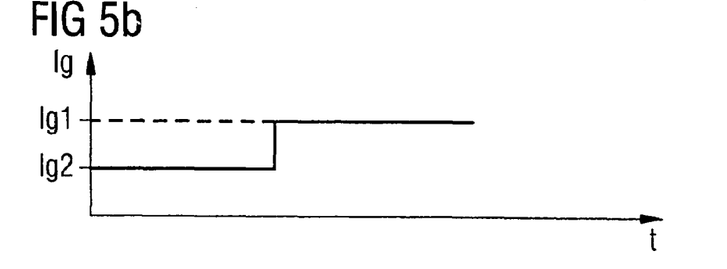
Figure 6A:
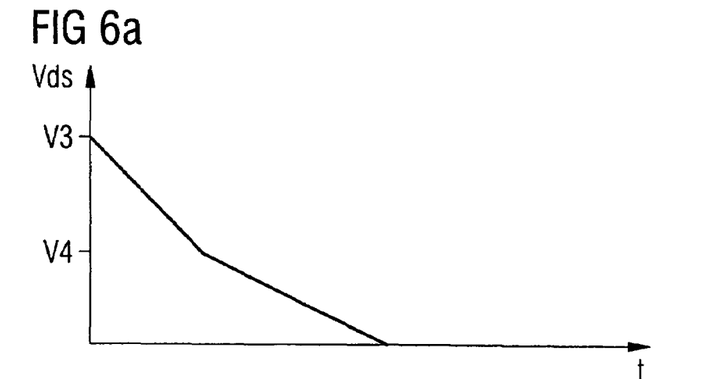
FIGS. 6a–6b illustrate the profile of the drive voltage (FIG. 6a) and of a charging current (FIG. 6b) for a two-stage drive method for turning off the semiconductor switch.
Figure 6B:
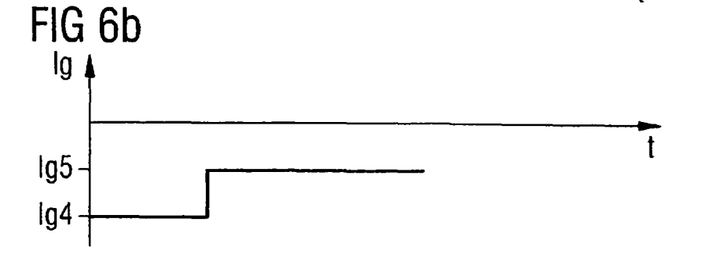

It is also possible for the drive operation to be configured in only two stages both for turning on and for turning off, and this is illustrated in FIGS. 5 and 6.

FIG. 5*a* shows the time profile of the drive voltage Vgs for such a two-stage turn on method, in which the drive voltage Vgs rises at first more flatly in a first section up to a reference value V2, and rises more steeply in a subsequent second section. In this drive method, the ideal switching instant is preferably in the first section shortly before the end thereof. If in this method the actual switching instant deviates from the ideal switching instant, the reference value V2 is corrected from turn-on operation to turn-on operation until there is no such temporal deviation between the actual and ideal switching instant, or until this deviation is smaller than the prescribed reference value.

FIG. 5*b* shows the time profile of the drive current Ig for achieving the profile of the drive voltage illustrated in FIG. 5*a*.

FIG. 6*a* shows the time profile of the drive voltage Vgs for a two-stage turn off method, in which the drive voltage Vgs initially falls more steeply in a first section down to a reference value V4, and more flatly in a subsequent second section. In this drive method, the ideal switching instant is preferably in the second section shortly before the start thereof. If in this method the actual switching instant deviates from the ideal switching instant, the reference value V4 is corrected from turn-on operation to turn-on operation until there is no such temporal deviation between actual and ideal switching instant, or until this deviation is smaller than the prescribed reference value.

FIG. 6*b* shows the time profile of the drive current Ig for achieving the profile of the drive voltage illustrated in FIG. 6*a*.

It is also possible in the three-stage turn on and turn off method already explained to select the drive current such that the drive voltage Vgs ideally rises approximately perpendicularly during the first and third drive section. Moreover, it is also possible to select the drive current such that the drive voltage Vgs runs in a very flat fashion during the second drive section such that the initial value and the final value of the drive voltage Vgs are equal in this second drive section. Each MOSFET has a parasitic gate series resistance. If a constant voltage that is somewhat above the turn-on voltage Von is then applied to the outer gate terminal for the purpose of turning on, because of the RC time constant from the gate series resistance and gate capacitance the gate voltage, which is present at the actual transistor cells and not accessible from outside, is delayed and will rise sufficiently slowly in order to turn on the MOSFET.

It has been assumed in the method explained to this point that a temporal spacing was determined between the actual switching instant Tson (in FIG. 3*a*) or Tsoff (in FIG. 4*a*) in relation to a respective ideal switching instant, at least one of the parameters of the drive current Ig or the drive voltage Vgs having been varied as a function thereof. Instead of such a time difference measurement, it is also possible in a simplified embodiment to prescribe an instant up to which the switching operation should have taken place at the latest. This instant is, for example, a prescribed time duration after the start of the respective switching operation. The respective parameters of drive current Ig or drive voltage Vgs are varied in this method depending on whether a switching operation, that is to say turning on or turning off, has taken place at the prescribed instant.

LIST OF REFERENCE SYMBOLS

10 Drive circuit
Cgs Gate source capacitance
D Drain terminal
G Gate terminal
GND Reference potential
Id Load current
Ig1, Ig2 Charging currents
Ig3, Ig4 Discharging currents
M MOSFET
S source terminal
Sin input signal
Ta(.) ideal turn-off instants
Tid(.) ideal turn-on instants
Tsoff(.) actual turn-off instants
Tson(.) actual turn-on instants
V+ supply potential
V1(.), V2(.) reference potentials
V3 reference potential
V4(.), V5(.) reference potentials
Vgs drive voltage, gate-source voltage
Voff turn-off voltage
Von turn-on voltage
Vt threshold voltage
Z load

The invention claimed is:

1. A method for driving a semiconductor switching element having a switching state that is a function of a charge stored on a drive electrode, and which includes a drive terminal configured to receive a drive signal and a load path, the method comprising:
   a) applying a drive signal configured to switch the semiconductor element such that a change in the charge stored on the drive electrode occurs over time, the drive signal having one or more predetermined parameters that define a time profile of the drive signal,
   b) determining a deviation between an ideal switching instant of the semiconductor switching element and an actual switching instant of the semiconductor switching element, the ideal switching instant defined in reference to at least one of the time profile of the drive signal or a signal having a characteristic that is dependent on the time profile of the drive signal, and
   c) changing at least one of the one or more predetermined parameters of the drive signal for a next switching operation based on the determined deviation.

2. The method as claimed in claim 1, wherein step c) further comprises changing at least one parameter of the drive signal when the determined deviation exceeds a prescribed time reference value.

3. The method as claimed in claim 1, wherein step a) further comprises applying the drive signal to effect at least one of applying a charging current to the drive electrode or applying a discharging current to the drive electrode.

4. The method as claimed in claim 1, wherein the signal having the characteristic that is dependent on the time profile of the drive signal comprises a drive voltage at the drive electrode.

5. The method as claimed in claim 1, wherein step b) further comprises evaluating a voltage across the load path to determine the actual switching instant.

6. The method as claimed in claim 5, wherein step b) further comprises determining the actual switching instant such that the actual switching instant corresponds to an instant at which the voltage across the load path reaches a predetermined value with reference to a maximum load path voltage.

7. The method as claimed in claim 1, wherein step a) further comprises applying the drive signal such that the drive signal has, consecutively in time, at least one first section of a first time duration with a first amplitude, and a second section of a second time duration with a second amplitude, and wherein step c) further comprises changing the at least one parameter of the drive signal by changing at least one of the first time duration, the second time duration, the first amplitude or the second amplitude.

8. The method as claimed in claim 7, wherein step c) further comprises changing the at least one parameter of the drive signal by changing the first time duration based on the determined deviation.

9. The method as claimed in claim 7, wherein step c) further comprises changing the at least one parameter of the drive signal by changing the first amplitude based on the determined deviation.

10. The method as claimed in claim 1, wherein step a) further comprises applying the drive signal such that the time profile of the drive voltage for the switching operation has at least two sections of different gradient, and wherein step c) further comprises adjusting at least one of a time duration or the gradient of at least one of the at least two sections.

11. The method as claimed in claim 10, wherein the ideal switching instant is defined such that the ideal switching instant is within a second section of the at least two sections of the time profile of the drive voltage.

12. The method as claimed in claim 11, wherein step c) further comprises adjusting the time duration of a first section of the at least two sections based on the determined deviation.

13. The method as claimed in claim 12, wherein step c) further comprises adjusting the time duration by comparing the drive voltage with at least a first and a second reference value, and adjusting at least one of the reference values for the next switching operation based on the comparison.

14. The method as claimed in claim 10, wherein the ideal switching instant is defined with reference to a terminus of one of the at least two sections.

15. The method as claimed in claim 10, wherein the time profile of the drive voltage has at least three sections, each section having a different gradient.

16. The method as claimed in claim 15, wherein a second section of the at least three sections has a lesser gradient than a first section and a third section of the at least three sections.

17. The method as claimed in claim 16, wherein the ideal switching instant is defined such that the ideal switching instant is within the second section.

18. A method for driving a semiconductor switching element having a switching state that is a function of a charge stored on a drive electrode, and which has a drive terminal configured to receive a drive signal and a load path, the method comprising:
 a) applying a drive signal operable to switch the semiconductor switching element, the drive signal selected such that a change in the charge stored on the drive electrode occurs over time, the drive signal having at least one predefined signal parameter that defines the time profile of the drive signal,
 b) determining whether a switching operation of the semiconductor switching element has already been performed within a predefined window of a predefined instant with reference to the time profile of the drive signal, and
 c) changing at least one of the at least one predefined signal parameter of the drive signal for a next switching operation when no switching operation by the semiconductor switching element has been performed within the predefined window of the predefined instant.

19. The method as claimed in claim 18, wherein step b) further comprises determining whether the switching operation of the semiconductor switching element has already been performed within the predefined window of the predefined instant with reference to the time profile of the drive signal, the reference to the time profile of the drive signal being obtained from a drive voltage at the drive electrode.

20. The method as claimed in claim 18, wherein step c) further comprises changing at least one parameter of the drive signal for the next switching operation such that the time profile of the drive signal changes.

* * * * *